(12) United States Patent
Balocco et al.

(10) Patent No.: US 12,266,953 B1
(45) Date of Patent: Apr. 1, 2025

(54) DUAL CHEMISTRY RECHARGEABLE BATTERY SYSTEM FOR USE IN ELECTRIC APU-EQUIPPED COMMERCIAL TRUCKS

(71) Applicant: EControls, LLC, San Antonio, TX (US)

(72) Inventors: Bruno Balocco, Long Beach, CA (US); Kennon Guglielmo, San Antonio, TX (US)

(*) Notice: Subject to any disclaimer, the term of this patent is extended or adjusted under 35 U.S.C. 154(b) by 405 days.

(21) Appl. No.: 17/404,539

(22) Filed: Aug. 17, 2021

Related U.S. Application Data

(60) Provisional application No. 63/066,811, filed on Aug. 17, 2020.

(51) Int. Cl.
| | |
|---|---|
| *B60L 58/21* | (2019.01) |
| *B64D 41/00* | (2006.01) |
| *G01R 19/165* | (2006.01) |
| *H02J 7/00* | (2006.01) |

(52) U.S. Cl.
CPC ............ *H02J 7/0014* (2013.01); *B60L 58/21* (2019.02); *B64D 41/00* (2013.01); *G01R 19/16566* (2013.01); *B64D 2041/002* (2013.01)

(58) Field of Classification Search
CPC ....................................................... B60L 58/13
USPC ............................................................ 320/104
See application file for complete search history.

(56) References Cited

U.S. PATENT DOCUMENTS

| | | | |
|---|---|---|---|
| 3,278,785 A | 10/1966 | Hauth, Jr. | |
| 3,854,067 A | 12/1974 | Morgan | |
| 3,885,204 A | 5/1975 | Abels et al. | |
| 3,997,888 A | 12/1976 | Sato et al. | |
| 4,086,524 A | 4/1978 | Kremer | |
| 4,186,333 A | 1/1980 | Kremer | |
| 4,244,040 A | 1/1981 | Fondiller et al. | |
| 4,329,615 A | 5/1982 | Tanaka et al. | |
| 4,337,408 A | 6/1982 | Sone et al. | |
| 4,461,958 A | 7/1984 | Krohling et al. | |
| 4,659,960 A | 4/1987 | Toya et al. | |
| 4,795,944 A | 1/1989 | Stimson | |
| 4,814,665 A | 3/1989 | Sakura et al. | |
| 5,021,494 A | 6/1991 | Toya | |
| 5,366,827 A | 11/1994 | Belanger et al. | |
| 5,550,424 A | 8/1996 | Jennrich et al. | |
| 6,038,877 A | 3/2000 | Peiffer et al. | |
| 6,060,821 A | 5/2000 | Suzuki et al. | |
| 6,125,030 A | 9/2000 | Mola et al. | |

(Continued)

FOREIGN PATENT DOCUMENTS

| | | |
|---|---|---|
| CN | 101662054 A | 3/2010 |
| CN | 103625260 A | 3/2014 |

(Continued)

*Primary Examiner* — Edward Tso
*Assistant Examiner* — Ahmed H Omar
(74) *Attorney, Agent, or Firm* — William H. Quirk; Cassidi D. Banales; Rosenthal Pauerstein Sandoloski Agather LLP

(57) ABSTRACT

A dual chemistry battery system is disclosed that preserves the voltage of the primary battery in a vehicle while connected in parallel to a secondary battery. The system utilizes batteries with different chemistry and voltage output characteristics to maintain at least the necessary charge in the primary battery for starting the vehicle. Preferred embodiments utilize a lithium-ion Auxiliary Power Unit (APU) to preserve the charge of the vehicle's primary lead acid battery.

26 Claims, 5 Drawing Sheets

(56) References Cited

U.S. PATENT DOCUMENTS

| | | | |
|---|---|---|---|
| 6,162,559 A | 12/2000 | Vutetakis et al. |
| 6,276,161 B1 | 8/2001 | Peiffer et al. |
| 6,345,677 B1 | 2/2002 | Eckersley et al. |
| 6,361,897 B1 | 3/2002 | Snyder |
| 6,392,347 B2 | 5/2002 | Arping et al. |
| 6,399,238 B1 | 6/2002 | Oweis et al. |
| 6,455,988 B1 | 9/2002 | Weber et al. |
| 6,457,324 B2 | 10/2002 | Zeigler et al. |
| 6,482,541 B1 | 11/2002 | Bator et al. |
| 6,636,295 B2 | 10/2003 | Shiozawa |
| 6,637,807 B2 | 10/2003 | Gotz |
| 6,641,951 B1 | 11/2003 | Vutetakis et al. |
| 6,681,588 B1 | 1/2004 | Zeigler |
| 6,794,802 B2 | 9/2004 | Pollner |
| 6,841,293 B1 | 1/2005 | Dreulle et al. |
| 6,858,975 B1 | 2/2005 | Matsutani |
| 6,889,762 B2 | 5/2005 | Zeigler et al. |
| 6,965,514 B2 | 11/2005 | Beihoff et al. |
| 7,014,946 B2 | 3/2006 | Partington et al. |
| 7,023,174 B2 | 4/2006 | Fromme et al. |
| 7,128,179 B2 | 10/2006 | Szymanski |
| 7,163,088 B2 | 1/2007 | Jahns et al. |
| 7,175,379 B2 | 2/2007 | Sellhorn et al. |
| 7,258,184 B2 | 8/2007 | Shorney et al. |
| 7,304,453 B2 | 12/2007 | Eaves |
| 7,338,248 B2 | 3/2008 | Buchmann et al. |
| 7,448,227 B2 | 11/2008 | Zeigler et al. |
| 7,454,922 B2 | 11/2008 | Zeigler et al. |
| 7,548,429 B2 | 6/2009 | Miller |
| 7,553,583 B2 | 6/2009 | Eaves |
| 7,591,143 B2 | 9/2009 | Zeigler et al. |
| 7,591,303 B2 | 9/2009 | Zeigler et al. |
| 7,671,565 B2 | 3/2010 | Straubel et al. |
| 7,740,142 B2 | 6/2010 | Miller et al. |
| 7,872,449 B2 | 1/2011 | Gutlen |
| 7,876,913 B2 | 1/2011 | Kobayashi et al. |
| D642,120 S | 7/2011 | Kretschmer |
| 8,026,698 B2 | 9/2011 | Scheucher |
| 8,027,484 B2 | 9/2011 | Yoshida et al. |
| 8,036,396 B2 | 10/2011 | Sakamoto et al. |
| 8,113,311 B2 | 2/2012 | Herrmann et al. |
| 8,141,377 B2 | 3/2012 | Connell et al. |
| 8,453,722 B2 | 6/2013 | Zeigler et al. |
| 8,464,679 B2 | 6/2013 | Permuy et al. |
| 8,517,087 B2 | 8/2013 | Zeigler et al. |
| 8,550,048 B2 | 10/2013 | Stifel et al. |
| 8,614,540 B2 | 12/2013 | Braeuchle et al. |
| 8,728,642 B2 | 5/2014 | Maskew et al. |
| 8,763,759 B2 | 7/2014 | Viereck et al. |
| 8,815,429 B2 | 8/2014 | Hostler et al. |
| 8,817,998 B2 | 8/2014 | Inoue |
| 8,839,753 B2 | 9/2014 | Burrows et al. |
| 8,942,836 B2 | 1/2015 | Inoue et al. |
| 8,963,481 B2 | 2/2015 | Prosser et al. |
| 9,042,569 B2 | 5/2015 | Sakamoto et al. |
| 9,065,103 B2 | 6/2015 | Straubel et al. |
| 9,118,094 B2 | 8/2015 | Tsujimura et al. |
| 9,252,466 B2 | 2/2016 | Norton |
| 9,368,836 B2 | 6/2016 | Coowar et al. |
| 9,487,063 B2 | 11/2016 | Zeigler et al. |
| 9,694,651 B2 | 7/2017 | Zeigler et al. |
| 9,729,966 B2 | 8/2017 | Pan |
| 9,783,024 B2 | 10/2017 | Connell et al. |
| 9,796,239 B2 | 10/2017 | Connell |
| 9,840,130 B2 | 12/2017 | Connell |
| 9,874,384 B2 | 1/2018 | Connell et al. |
| 10,006,684 B2 | 6/2018 | Connell et al. |
| 10,081,226 B2 | 9/2018 | Connell et al. |
| 10,181,590 B2 | 1/2019 | Zeiler et al. |
| 10,205,363 B2 | 2/2019 | Li et al. |
| 10,218,239 B2 | 2/2019 | Li et al. |
| 10,245,916 B2 | 4/2019 | Mayo Mayo et al. |
| 10,263,488 B2 | 4/2019 | Yang et al. |
| 10,320,274 B2 | 6/2019 | Yang et al. |
| 10,367,239 B1 | 7/2019 | Dao |
| 10,369,863 B2 | 8/2019 | Connell et al. |
| 10,414,243 B2 | 9/2019 | Connell |
| 10,665,893 B2 | 5/2020 | Zhang et al. |
| 10,703,173 B2 | 7/2020 | Connell et al. |
| 2001/0052968 A1 | 12/2001 | Shiozawa |
| 2003/0132041 A1 | 7/2003 | Beihoff et al. |
| 2004/0142238 A1 | 7/2004 | Asahina et al. |
| 2004/0173408 A1 | 9/2004 | Szymanski et al. |
| 2005/0008465 A1 | 1/2005 | Szymanski et al. |
| 2005/0031936 A1 | 2/2005 | Joos |
| 2007/0009787 A1 | 1/2007 | Straubel et al. |
| 2007/0188130 A1 | 8/2007 | Scheucher |
| 2008/0011553 A1 | 1/2008 | Mielke |
| 2008/0179118 A1 | 7/2008 | Herrmann |
| 2008/0213652 A1 | 9/2008 | Scheucher |
| 2008/0241667 A1 | 10/2008 | Kohn |
| 2008/0268330 A1 | 10/2008 | Hansen et al. |
| 2009/0134718 A1 | 5/2009 | Hurst et al. |
| 2011/0001352 A1* | 1/2011 | Tamura ............... B60L 58/21 |
| | | 307/9.1 |
| 2012/0116699 A1 | 5/2012 | Haag |
| 2012/0243130 A1 | 9/2012 | Gaben |
| 2012/0244398 A1 | 9/2012 | Youngs |
| 2012/0248868 A1 | 10/2012 | Mobin et al. |
| 2012/0299531 A1 | 11/2012 | Prosser et al. |
| 2013/0171480 A1 | 7/2013 | Englert et al. |
| 2013/0236745 A1 | 9/2013 | Norton |
| 2013/0270016 A1 | 10/2013 | Donnell et al. |
| 2014/0079977 A1 | 3/2014 | Tsujimura |
| 2015/0093653 A1 | 4/2015 | Coowar et al. |
| 2015/0318521 A1 | 11/2015 | Zeiler et al. |
| 2015/0375698 A1 | 12/2015 | Joao |
| 2016/0164063 A1 | 6/2016 | Angerbauer |
| 2016/0336623 A1 | 11/2016 | Nayar et al. |
| 2016/0347161 A1 | 12/2016 | Kusumi et al. |
| 2017/0001584 A1 | 1/2017 | Harris et al. |
| 2017/0331302 A1 | 11/2017 | Namiki |
| 2018/0026456 A1 | 1/2018 | Kang |
| 2018/0108890 A1 | 4/2018 | Fees et al. |
| 2018/0241074 A1 | 8/2018 | Zhang |
| 2019/0103639 A1* | 4/2019 | Guglielmo ......... H01M 50/249 |
| 2019/0193622 A1 | 6/2019 | Moon |
| 2022/0416312 A1 | 12/2022 | Zeiler |

FOREIGN PATENT DOCUMENTS

| | | |
|---|---|---|
| CN | 106129457 A | 11/2016 |
| CN | 112550462 A | 3/2021 |
| DE | 102005053305 A1 | 5/2007 |
| DE | 102012106885 A1 | 1/2014 |
| DE | 102012107700 A1 | 1/2014 |
| DE | 102012107604 A1 | 2/2014 |
| DE | 102012107670 A1 | 2/2014 |
| DE | 102013113809 A1 | 6/2015 |
| DE | 102013114894 A1 | 7/2015 |
| DE | 102014106795 A1 | 11/2015 |
| EP | 0620604 A2 | 10/1994 |
| EP | 0662725 B1 | 9/2000 |
| EP | 1079982 B1 | 3/2004 |
| EP | 1961596 A3 | 12/2009 |
| EP | 1985481 B1 | 12/2010 |
| EP | 2261167 A1 | 12/2010 |
| EP | 1515304 B1 | 4/2012 |
| EP | 1961599 B1 | 7/2013 |
| EP | 2650251 A1 | 10/2013 |
| EP | 2700611 A1 | 2/2014 |
| EP | 3065959 A1 | 9/2016 |
| EP | 2008354 B1 | 10/2016 |
| EP | 2945215 B1 | 8/2017 |
| EP | 3217134 A1 | 9/2017 |
| EP | 3193105 A3 | 12/2017 |
| EP | 3287718 A1 | 2/2018 |
| EP | 3301379 A1 | 4/2018 |
| EP | 3323187 A1 | 5/2018 |
| EP | 3323188 A1 | 5/2018 |
| EP | 3323189 A1 | 5/2018 |
| EP | 3323190 A1 | 5/2018 |
| EP | 2969613 A1 | 8/2018 |
| EP | 3125332 B1 | 9/2018 |

(56) References Cited

FOREIGN PATENT DOCUMENTS

| | | | |
|---|---|---|---|
| EP | 3386786 A1 | 10/2018 | |
| EP | 3507115 A1 | 7/2019 | |
| EP | 2944493 B1 | 12/2019 | |
| EP | 2889930 B1 | 9/2020 | |
| EP | 2969615 B1 | 6/2021 | |
| GB | 2086323 A | 7/1981 | |
| JP | 2011-508366 A | 3/2011 | |
| JP | 2014-96236 A | 5/2014 | |
| JP | 2014-108052 A | 6/2014 | |
| JP | 2014-187730 A | 10/2014 | |
| JP | 2015214167 A * | 12/2015 | ............. B60L 58/13 |
| KR | 10-2008-0060585 | 7/2008 | |
| KR | 10-2021-0111371 A | 9/2021 | |
| WO | 2006124663 A2 | 11/2006 | |
| WO | 2007095327 A2 | 8/2007 | |
| WO | 2014143899 A1 | 9/2014 | |
| WO | 2017004078 A1 | 1/2017 | |
| WO | 2017106104 A1 | 6/2017 | |
| WO | 2019014653 A1 | 1/2019 | |

* cited by examiner

DUAL CHEMISTRY RECHARGEABLE BATTERY SYSTEM FOR USE IN ELECTRIC APU-EQUIPPED COMMERCIAL TRUCKS

CLAIM OF PRIORITY TO PRIOR APPLICATION

This application claims the benefit of the filing date of U.S. Provisional Application Ser. No. 63/066,811, filed on Aug. 17, 2020, entitled "Dual Chemistry Rechargeable Battery System for Use in Electric APU-Equipped Commercial Trucks." By this reference the entire disclosure, including the claims and drawings, of U.S. Provisional Ser. No. 63/066,811 is hereby incorporated into the present disclosure as though now set forth in its entirety.

BACKGROUND OF THE INVENTION

1. Field of the Invention

The present invention primarily relates to rechargeable commercial truck battery systems for supplying electric power for starting the engine as well as for lighting, sound systems, heating, ventilation, air conditioning, etc., whether the engine is running or not, as well as to related aspects of use. More particularly, the invention is most directly related to rechargeable commercial truck battery systems with primary and auxiliary batteries, wherein the system is designed to retain sufficient voltage for starting the engine, in commercial trucks with sleeper cabins or other vehicles that support occupants for extended periods of time.

2. Description of Related Art

Especially when commercial trucks in the field are equipped with electric auxiliary power units, it has long been known that it can be important to retain sufficient voltage in the primary battery when the engine is turned off, so that the engine can still be started when necessary. To achieve as much, prior systems include a battery separator (a/k/a, a battery isolator) that can be engaged manually or by a controller when the voltage in the primary battery drops below a predetermined threshold. IdleFree Systems, of Watertown, Wisconsin, for instance, purportedly markets one such product referred to as a "Battery Separator, and Bergstrom, Inc., of Rockford, Illinois, purportedly has commercialized comparable battery isolators as part of its Bergstrom NITE Plus System. Many others have also long commercialized battery isolators to address the need to retain sufficient power to effectively operate the commercial truck's engine starter.

Rechargeable Lead-Acid batteries are the most common batteries used in the field, although batteries with lithium ion and other chemistries have also long been known for use in commercial trucks. Today, the most popular lithium-ion batteries are of the LCO type, with lithium nickel cobalt aluminum oxide (NCA, or $LiNiCoAlO_2$) and lithium nickel manganese cobalt oxide (NMC, or $LiNiMnCoO_2$) being particularly popular. Other alternative cathode compositions have included other lithium metal oxides such as lithium manganese oxide (LMO) and lithium manganese nickel oxide (LMNO), and other lithium-ion chemistries can be considered for particular needs. Lithium metal phosphates, for instance, have also long been theoretically available for improved cycle counts, shelf life, and safety, although other performance trade-offs have made them less popular than LCO types amongst manufacturers. As one particular type of lithium metal phosphate, lithium iron phosphate (LFP, or $LiFePO_4$) batteries have long been known as an available type of rechargeable lithium-ion battery, with various pros and cons relative to NCA, NMC and other LCO batteries.

LFP batteries tend to have lower energy densities than NCA and NMC batteries. However, LFP batteries are generally safer due to their greater thermal and chemical stability. Thermal runaway for LFP batteries typically does not occur until around 270° C., which improves safety and decreases the likelihood of catastrophic failure. LFP batteries are also more stable under short circuit or overcharge conditions and will not readily decompose at high temperatures. As other arguable advantages, LFP batteries also tend to have greater energy density (i.e., they can source higher power levels per unit volume) as well as greatly increased cycle life in comparison to lead-acid batteries. While common lead-acid batteries have an average life of 300 to 500 cycles with 20% degradation of stored charge, LFP batteries can last over 2000 to 3000 cycles with the same 20% or possibly less, such as 10% degradation of stored charge.

Meanwhile in the field of the present disclosure, safety guidelines and federal regulations limit the number of hours a commercial truck driver is allowed to drive. Often when a driver is required to rest or sleep, there are little to no options to do this outside of the vehicle. Vehicle-mounted secondary heating, ventilation, and air conditioning (HVAC) systems are utilized to provide drivers a comfortable environment while remaining in the vehicle, especially when outside temperatures are extreme.

Despite long availability of auxiliary power units (APUs) to operate vehicle mounted HVAC systems, and to benefit other functions of the vehicle, existing designs are not without their drawbacks. Currently, there are two options for APU designs-diesel powered or electric battery-based models. Diesel models are more powerful and can run for long periods but consume fuel to operate and are more expensive to maintain or replace, when compared with electric units. Electric APUs are limited in cooling capacity and runtime by the capacity of their batteries. However, they generate virtually zero emissions when discharging, and are therefore compliant with current emission standards.

Many choose to use electric APUs, because they are cheaper, quieter, and do not use additional fuel during operation. Existing electric APUs typically use conventional lead-acid batteries to power the APU. Commercial trucks also typically use a conventional lead-acid battery for starting the truck as well as powering other features of the truck. Typically, both the lead-acid starting battery and the lead-acid APU battery are charged by the truck's alternator.

When the truck is stopped and the APU is running, the lead-acid starting battery needs to be protected from over-discharge, otherwise the lead-acid starting battery will not be capable of starting the truck. In order to protect the lead-acid starting battery from over-discharging, systems typically use a switch, such as a contactor or isolator. When the switch is closed, current may be drawn from both the APU battery and the starting battery. When preserving the charge of the lead-acid starting battery, the switch is opened, which isolates the starting battery thus allowing current to be drawn only from the lead-acid APU battery. One obvious drawback to this battery system configuration is the need to include an additional device, i.e., a contactor or isolator, for the system to protect the starting battery of the commercial truck from over-discharge during use of the lead-acid battery-powered APU.

As a result of the above-mentioned and other reasons, there is a need for a lithium-ion battery APU not only as an alternative that has greater energy capacity, a longer life cycle, charges quickly, and reliably operates for the duration of a full rest period, but also a lithium-ion battery APU that can protect the starting battery of the truck from over-discharging without the need for any additional devices. Therefore, despite the well-known characteristics and long availability of rechargeable LFP and other lithium-ion battery technologies, there are still substantial and long-felt unresolved needs for the implementation of improved battery technology in the transportation industry.

SUMMARY OF THE INVENTION

Preferred embodiments incorporate a lithium-ion battery powered auxiliary power unit (APU) for use in commercial trucks with primary starter batteries. The APU batteries are chosen, designed and configured in a manner that protects the primary starter batteries from discharge below a reserve voltage level desired to make sure the starter batteries are still charged enough for starting the engine. The voltage desired to be maintained for powering the ignition system and thereby starting the engine is referred to in this description as the "retained" or "reserve" starter voltage. To be safe, preferred embodiments are designed to work with a reserve starter voltage that is roughly the same as the primary battery's nominal voltage. In other words, the APU batteries protect the primary starter batteries from discharge below the nominal voltage of the primary battery system.

To protect the primary batteries from over discharge, the APU's lithium-ion battery (or a combination of batteries is some embodiments) is connected in parallel with the starting battery of the commercial truck. In disclosed embodiments, the charge storing chemistries of each of the batteries should be different, with the APU battery having a chemistry that enables a higher current draw than the chemistry of the starter batteries, such that during parallel discharge, the APU battery will discharge preferentially relative to (i.e., more than or before) the starter battery discharges. In preferred embodiments, the preferential discharge of the APU battery rather than the primary battery is assured at voltage levels above the nominal voltage level of the primary battery system. Hence, for a 12-volt nominal battery as the primary battery, the APU battery is preferentially discharged over a voltage range in excess of twelve volts. Granted, while the ignition system of a typical engine can still achieve ignition when the primary batteries are less than the nominal voltage, some benefits of the present invention can be achieved with alternative embodiments designed to allow preferential discharge to voltage levels that are considerably less than the nominal voltage. Nonetheless, preferred embodiments are designed to preferentially discharge the APU batteries until they are at their minimum state of charge levels at a voltage that is still above or approximately the same as the nominal voltage level.

More particularly, in the most preferred embodiments, the preferential discharge of the APU battery is designed to occur over a voltage range of between 12.8 and 13.2 volts for a nominal voltage of twelve volts. By combining multiples of the preferred APU batteries in series, multiples of that 12-volt approach can also be achieved for systems having a nominal voltage of 24, 36 or 48 volts, with preferential discharge over ranges of 25.6-26.4 volts, 38.4-39.6 volts, and 51.2-52.8 volts, respectively, and those of skill in the art can achieve comparable ratios for systems with virtually any nominal voltage level.

Such preferential discharge of the APU batteries is achieved by selecting and designing the charge storing chemistry of the APU battery(ies) so that most if not all of the state-of-charge operating range of those APU batteries discharges at voltage levels that are comparable to the nominal voltage of the system but that are also above the desired reserve starter voltage level (which can be the same as the nominal voltage level in some embodiments).

While such preferential discharge characteristics are relative in nature, it can also be considered that the primary starter battery in preferred embodiments has a charge storage chemistry that results in more rapid voltage drop per change in state of charge than the auxiliary batteries' chemistry, particularly at voltages above the nominal voltage for the primary starter battery. For these purposes, we refer to both the "speed of voltage drop" and the "steepness of the discharge curve" as reflecting the magnitude of voltage drop from a full or almost full charge over a given percentage drop of the battery's state of charge.

With "shallow" referring to the opposite of "steep" in the context of discharge curves, preferred embodiments use of an APU battery with a charge storage chemistry that is shallower than the discharge curve of the primary electric battery system, particularly over the working voltage range of the APU battery system, said shallow discharge curve being representative of the relatively low rate of voltage reduction per reduction of state of charge ("SOC") of the secondary batteries as compared to said primary electric battery system over that range. This is largely because the electric charge storing chemistry of the APU battery enables a higher current draw than the primary electric battery system over that range, at least when connected in parallel to the primary electric battery system. As a result, the APU battery chemistry and design enables preferential discharge of the APU batteries relative to the vehicle's primary electric battery system over a voltage range above the reserve ignition voltage for the primary electric battery system. The electric charge storing chemistry of the APU batteries particularly enable a higher current draw than the primary electric battery system over voltage ranges above the nominal voltage value when the charge storing chemistry of the primary electric battery system is conventional lead acid, thereby enabling preferential discharge of the full operating charge for the APU batteries before the primary electric battery system is significantly reduced, and certainly before it is reduced below its nominal voltage. Indeed, according to the most preferred teachings of the present invention, preferential discharge of the APU batteries is preferably designed to occur over a voltage range from between about 12.8 and 13.2 volts for an APU battery system with a nominal voltage of twelve volts.

In many preferred embodiments, the primary starting battery for the commercial truck may be a conventional lead-acid battery, whereas the chemistry of the auxiliary battery is preferably lithium-ion based, most preferably having a lithium metal phosphate chemistry such as LFP. Other alternative chemistries may be used as the commercial truck's starting battery or the APU, so long as they fall within the scope of the invention. The APU battery should be selected from the available battery types that utilize a different chemistry, e.g., lithium-ion chemistry, from that chosen for the commercial truck's starting battery.

Preferred embodiments include lithium iron phosphate (LFP) chemistry for the lithium-ion battery in the APU. It is the different chemistries of the two batteries, as well as the connection of the two batteries in parallel, that enable the system to preserve the charge on the starting battery, i.e., the conventional lead-acid battery for starting the commercial truck, while the APU is in use. Only the lithium-ion battery is significantly discharged during the operation of the APU. In the disclosed system, no additional devices are needed to preserve the charge of the starting battery.

The APU unit is able in part to power vehicle-mounted secondary power systems such as heating, ventilation, and air conditioning (HVAC) systems, which is particularly useful when the vehicle engine is off.

The innovations of preferred embodiments of the present invention improve operations of electric auxiliary power units (APUs). Operations are improved in part, by enabling vehicle-mounted secondary heating ventilation and air conditioning (HVAC) systems in commercial trucks, and other vehicles, to run for longer periods to allow drivers to comfortably sleep or relax the entire necessary rest period without having to consume fuel by running a diesel APU, or by idling the main truck engine. The improved runtime when compared to lead acid batteries is possible due in part to the greater energy density of the chemical properties of lithium-ion batteries.

Further, the lithium-ion battery cells incorporated into the presently disclosed embodiments charge significantly faster, degrade at a much slower rate, and they further maintain greater charge capacity for significantly longer than conventional lead-acid batteries. It is contemplated that the battery modules in the disclosed battery module assembly are recharged by the commercial truck's alternator during operation of the engine. Alternatively, preferred embodiments are capable of being charged by truck stop electrification, using an external power supply sourcing power from the grid when available, to recharge the batteries and/or simultaneously to run the electric APU.

Presently, preferred embodiments of the present invention's exterior dimensions are consistent with a double length Group 31 form factor and consists of one positive and one negative cell array each with two banks of cells, for a total of four banks in the battery module assembly. Each bank of cells contains 72 individual lithium-ion battery cells connected in parallel in preferred embodiments. Within each module, individual battery cells are connected using an approach that is comparable to the Tesla method of wire bonded battery manufacture. An important difference from Tesla, however, involves the use of LFP battery technologies rather than NCA or other LCO battery technologies, as previously discussed. Individual battery cells are wire bonded to collector plate printed circuit board assemblies (PCBA) in each cell array. Presently, preferred embodiments of an APU system will include two battery module assemblies and would typically include 4 Group 31 lead acid batteries.

Disclosed embodiments of the positive and negative cell array are similarly assembled in a manner that allows components such as the positive and negative bus terminal terminals to protrude from the plastic lid of the battery module assembly. The positive cell array contains a collector plate printed circuit board PCBA that is has an integrated battery management system (BMS) that monitors and/or actively manages battery cell characteristics such as temperature, voltage, and current for the entire system. Located between the battery cells and the collector plates PCBA are plastic battery trays and a structural adhesive. A structural adhesive is used between the top plastic battery tray and the collector plate PCBA. Additionally, the same adhesive is used between the battery cells and the top and bottom plastic battery trays.

BRIEF DESCRIPTIONS OF THE DRAWINGS

Figure 5:
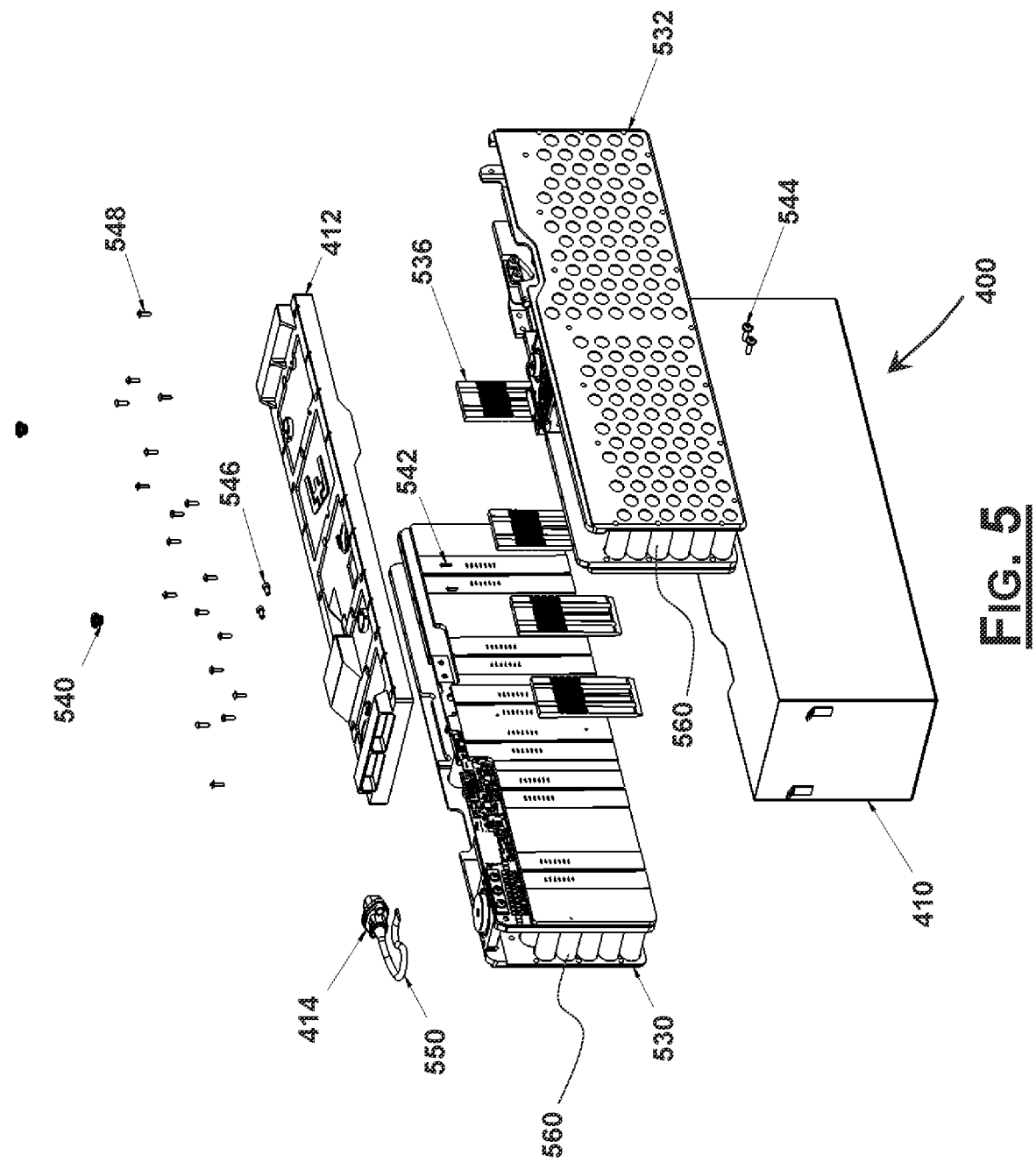

FIG. 5 is an exploded view of battery module assembly 400. Battery module assembly 400 includes a positive cell array 530 and a negative cell array 532.

DETAILED DESCRIPTIONS OF PREFERRED EMBODIMENTS

The following descriptions relate to presently preferred embodiments and are not to be construed as describing limits to the invention, whereas the broader scope of the invention should instead be considered with reference to the claims, which may be now appended or may later be added or amended in this or related applications. Unless indicated otherwise, it is to be understood that terms used in these descriptions generally have the same meanings as those that would be understood by persons of ordinary skill in the art. It should also be understood that terms used are generally intended to have the ordinary meanings that would be understood within the context of the related art, and they generally should not be restricted to formal or ideal definitions, conceptually encompassing equivalents, unless and only to the extent that a particular context clearly requires otherwise.

For purposes of these descriptions, a few wording simplifications should also be understood as universal, except to the extent otherwise clarified in a particular context either in the specification or in particular claims. The use of the term "or" should be understood as referring to alternatives, although it is generally used to mean "and/or" unless explicitly indicated to refer to alternatives only, or unless the alternatives are inherently mutually exclusive. When referencing values, the term "about" may be used to indicate an approximate value, generally one that could be read as being that value plus or minus half of the value. "A" or "an" and the like may mean one or more, unless clearly indicated otherwise. Such "one or more" meanings are most especially intended when references are made in conjunction with open-ended words such as "having," "comprising" or "including." Likewise, "another" object may mean at least a second object or more.

Figure 1:
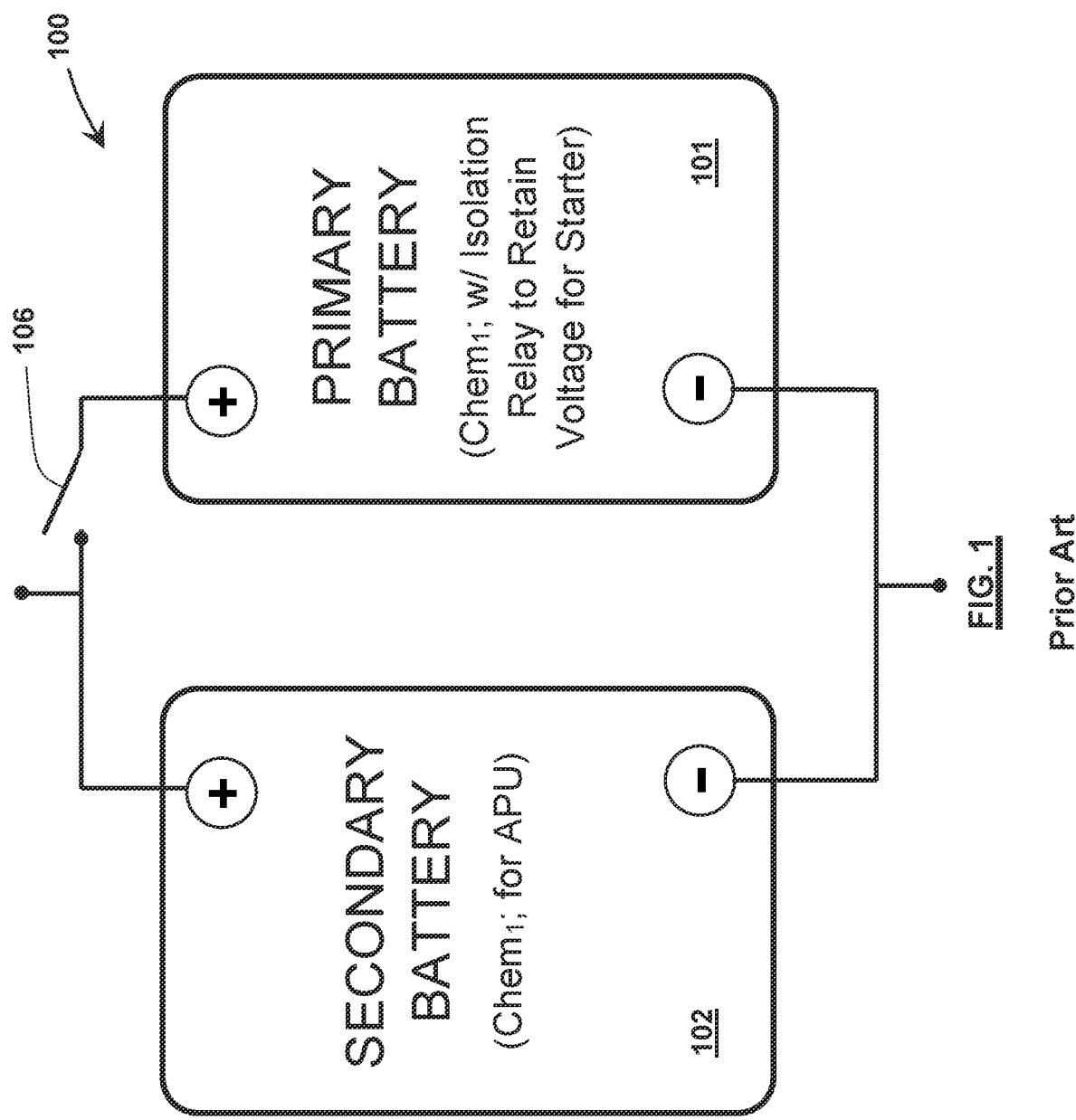
FIG. 1 is a simplified schematic illustrating a prior art two-battery system.

Referring to FIG. 1, there is shown a schematic representation of a conventional system 100 incorporating two batteries-namely, primary battery 101 and secondary battery 102. The particular environment of the two batteries 101 and 102 is in the electric power system of a commercial truck (not shown), where they are normally connected in parallel (when relay 106 is closed). In this illustration of prior art, each of the batteries 102, 101 is a conventional lead-acid battery (both being designated as having "Chem$_1$" in FIG. 1). Battery 102 is incorporated into an auxiliary power unit (APU) as referenced, and battery 102 is designated as the secondary battery and is alternatively referred to in this description as the APU battery. Battery 101 is the battery used for starting the commercial truck, while it is also the primary battery for powering many of the secondary electric systems in the commercial truck. Hence, for reference, battery 101 is designated as the primary battery and serves as the main (or primary) battery system for the commercial truck. The main battery system may alternatively be referred to as the starting battery in this description. It should be understood that each battery 102, 101 may actually each include multiple batteries so long as the voltages are nominally similar or at least comparable, such as is recommended for the parallel configuration as shown. For these purposes, we refer to the nominal voltages of two batteries or battery systems as being comparable if their nominal voltages are close enough that those of skill in the art would understand that either battery could be used in place of the other in a particular application without changing other aspects of that particular application. For example, a nominal battery voltage of anywhere from about 11 to about 15 volts would be comparable to a nominal battery voltage of 12 volts in most if not all applications. It should also be recognized that, even though some embodiments are described with voltage levels to the precision of a tenth of a volt, most references should be interpreted as approximations by default, especially when described as being "about" a certain number, or words to that effect. Rather than being limited to the precise number, reference to "about" a certain number should be interpreted as one of ordinary skill in the art would understand as being about the same. In the absence of more information to clarify, one should interpret an "about" reference to voltage levels as allowing for variability of at least plus or minus a half of a volt.

As will be understood by those of skill in the art, APU battery 102 is used, at least in part, to power a secondary HVAC system for use in the commercial truck, typically when the commercial truck is not being driven. When the engine of the truck is running, each battery 102, 101 is charged by the alternator (not shown) associated with the commercial truck. Secondary battery 102 and primary battery 101 are connected to each other in parallel. Because the starting battery 101 must have a minimum charge to start the commercial truck, when the APU battery 102 is being discharged, protection with an isolation relay 106 is advisable to prevent over-discharge of the starting battery 101.

For the purposes of maintaining a sufficient charge on starting battery 101 for starting the commercial truck, prior systems are known to use a mechanism such as a relay 106. When relay 106 is closed, current may be drawn from each of the batteries 102, 101. In typical operation, when current is initially drawn and switch 108 is closed, each battery 102, 101 will begin to be discharged. When primary battery 101 is discharged to approximately 80% of its charge capacity, relay 106 will be opened. When relay 106 is open, as shown in FIG. 1, starting battery 101 is effectively isolated such that current cannot be drawn from starting battery 101. An open relay 106 only allows current to be drawn from APU battery 102. This protects starting battery 101 from over-discharging while the APU system is operating and while the commercial truck is not running, i.e., the commercial truck's engine is turned off. Relay 106 may be incorporated into a battery isolator or separator device for the express purposes of isolating primary battery 101 to prevent excessive discharge during the discharge cycle of primary battery 102.

Figure 2:
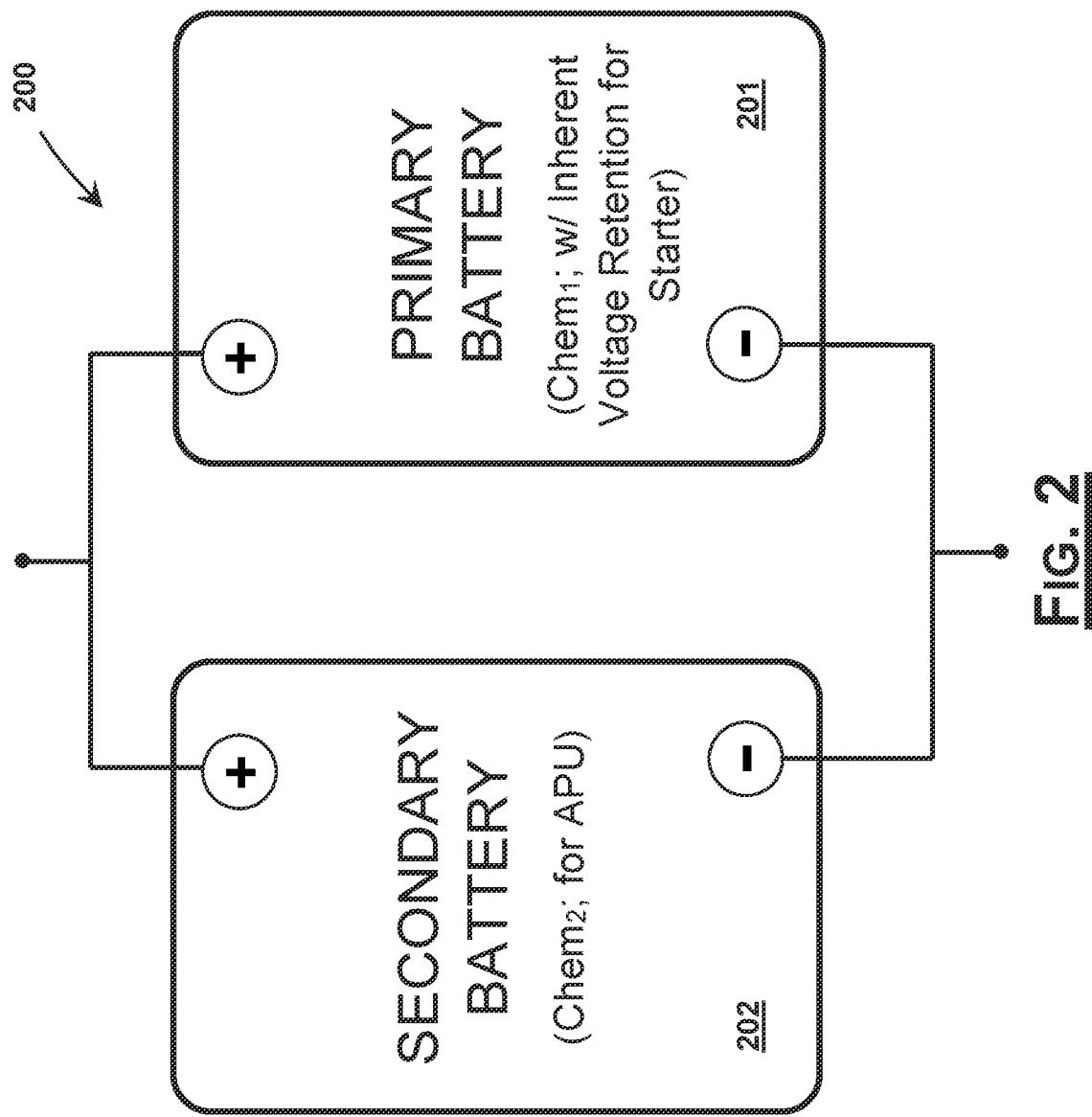
FIG. 2 is a simplified schematic illustrating the incorporation of a dual chemistry approach according to teachings of the present invention.

FIG. 2 represents a simplified schematic of a proposed dual chemistry battery system 200 which uses two batteries—primary battery 201 and secondary battery 202—according to the teachings of the present invention. To the extent within the scope of the claims that are appended or later added to this description, the environment for the two batteries may be in any system where two batteries are being used in parallel, although the preferred embodiments are presently contemplated for use primarily in commercial trucks. A principal purpose for the primary battery 201 is to effectively operate the starter for the truck's engine. The principal purpose of the secondary battery 202, on the other hand, is to function as part of an electric APU for the truck. According to the principal teachings of the present invention, the primary battery 201 is characterized by electric cells having one chemistry ("$Chem_1$"), while the secondary battery 202 is characterized by electric cells having a second chemistry ("$Chem_2$") that exhibits a more gradual voltage-to-state-of-charge discharge profile than does $Chem_1$.

More particularly, in embodiments that are presently preferred, the secondary battery 202 is a rechargeable lithium-ion battery connected in parallel to the primary battery 201, which is wired and configured to serve as the starting battery for the commercial truck. Even more particularly, secondary battery 202 is a lithium iron phosphate (LFP) battery. Further details of secondary battery 202 will be explained in connection with subsequent drawing figures. With respect to primary battery 201, one requirement is that the chemistry of the primary battery have a steeper discharge profile from its more fully charged states than that of secondary battery 202. In many embodiments, primary battery 201 is a conventional lead-acid battery. However, primary battery 201 may use any chemistry, including other lithium-ion-based chemistries, so long as it has a steeper discharge profile from its more fully charged states as compared to comparable discharge profiles for the chemistry used in secondary battery 202.

When secondary battery 202 and primary battery 201 are connected in parallel, and when each battery 201, 202 is fully charged, once current is being drawn, there is a sequential discharge of the batteries 202, 201. More particularly, secondary battery 202, by virtue of its chemistry and higher current draw, will be discharged first followed by primary battery 201, if necessary. This sequential discharge mimics what occurs when conventional systems incorporate a battery isolator and switch 106 is opened; however, no active device such as a battery isolator is required in the system as illustrated in FIG. 2. When both batteries 202, 201 are completely discharged, there is also a sequential aspect to recharging each of the batteries 202, 201. Primary battery 201 will charge first, followed by secondary battery 202. It should be understood that, although preferred embodiments do not have an isolator relay, such relays or the like may also be used in combination with some variations of the present invention, to the extent consistent with the corresponding claims of the invention, when properly construed.

Figure 3:
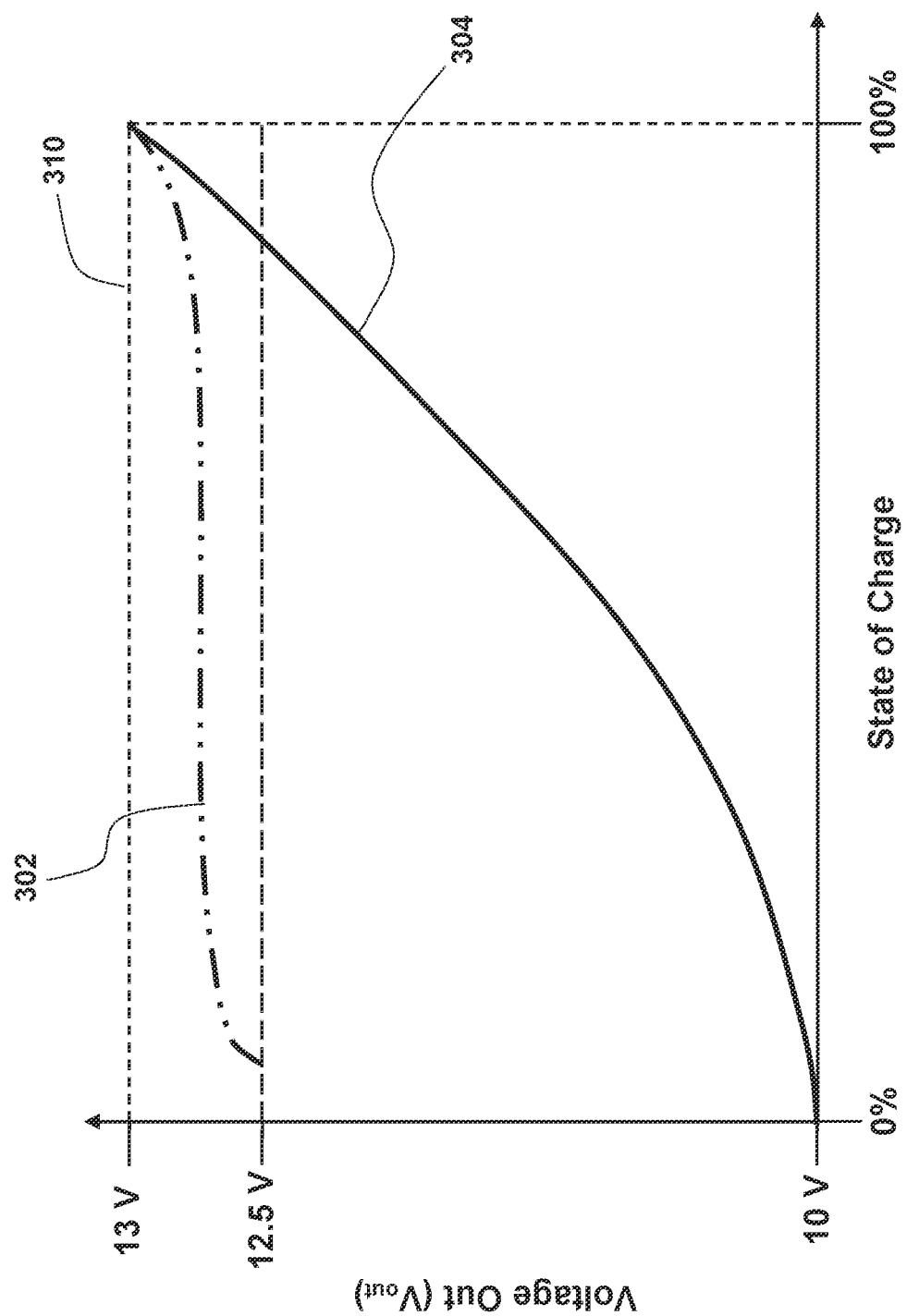
FIG. 3 is a graph showing the voltage curve dynamics for a conventional lead-acid battery and the preferred lithium-ion battery system as the voltage out for each battery type relates to the state of charge of each of the battery types.

Turning now to FIG. 3, there is shown a graph of the voltage out of batteries 202 and 201 versus the state of charge (%) of each battery type. A battery's state of charge refers to the remaining useful energy in the battery at any given time. It should be understood that the values for the voltage as shown in the graph are exemplary and are not meant to be limiting. Curve 302 represents the LFP APU battery 202, and curve 304 represents the conventional lead-acid starting battery 201.

When selecting a combination of the different chemistries for batteries 201 and 202, two concepts should be considered in order to produce a sequential discharge without requiring intervention by any active devices, in line with the teachings of the present invention. One consideration is that the voltage output of the secondary battery 202 should overlap, or at least have an overlapping section, with the voltage output of the primary battery 201, but the profiles should be different, as evidenced by the representative curves illustrated in FIG. 3. To explain this concept, reference is made to box 310, represented by the small-dash dashed line across the top and down the right side of the graph. The x-axis and y-axis of the graph represent the other two sides of box 310. The voltage characteristics of the secondary battery 202 should lie completely within box 310. Another consideration is that any secondary battery 202 contemplated for inclusion in the disclosed system should have a lower depletion of voltage per state of charge reduction as compared to primary battery 201.

Curve 302 represents the discharge profile of the LFP chemistry, which preferably characterizes secondary battery 202. Curve 304, on the other hand, represents the discharge profile of the lead-acid chemistry, which preferably characterizes primary battery 201. As evident, the LFP curve 302 is substantially flat over the vast majority of its useful charge range. In contrast, the lead-acid curve 304 is steeper than curve 302 (i.e., it has a much more significant slope per change in state of charge), particularly and most importantly in the upper portions (for example, the upper third) of its full state-of-charge range. Likewise, in alternative embodiments, any battery chemistry that has a curve that is steeper than the LFP curve 302 in its upper portions of its state of charge could be optionally combined in the disclosed system with the LFP APU battery 202 while still appreciating some aspects of the present invention. The voltage characteristics of LFP curve 302 are shown to fit entirely within box 310. Furthermore, LFP curve 302 clearly has a much lower depletion of voltage over its state of charge range as compared to lead-acid curve 304.

During operation of the disclosed dual chemistry battery system, current is drawn from both the APU battery 202 and the lead-acid battery 201. After an initial 3-5% drop in charge of the lead-acid battery 201, the current ceases to be drawn from lead-acid battery 201. Current continues to be drawn from APU battery 202 through its discharge cycle, and if the current continues for a sufficient time period, APU battery 202 will be completely discharged. Once APU battery 202 is completely discharged, current may then be drawn from lead-acid battery 201, if circumstances require as much.

Figure 4:
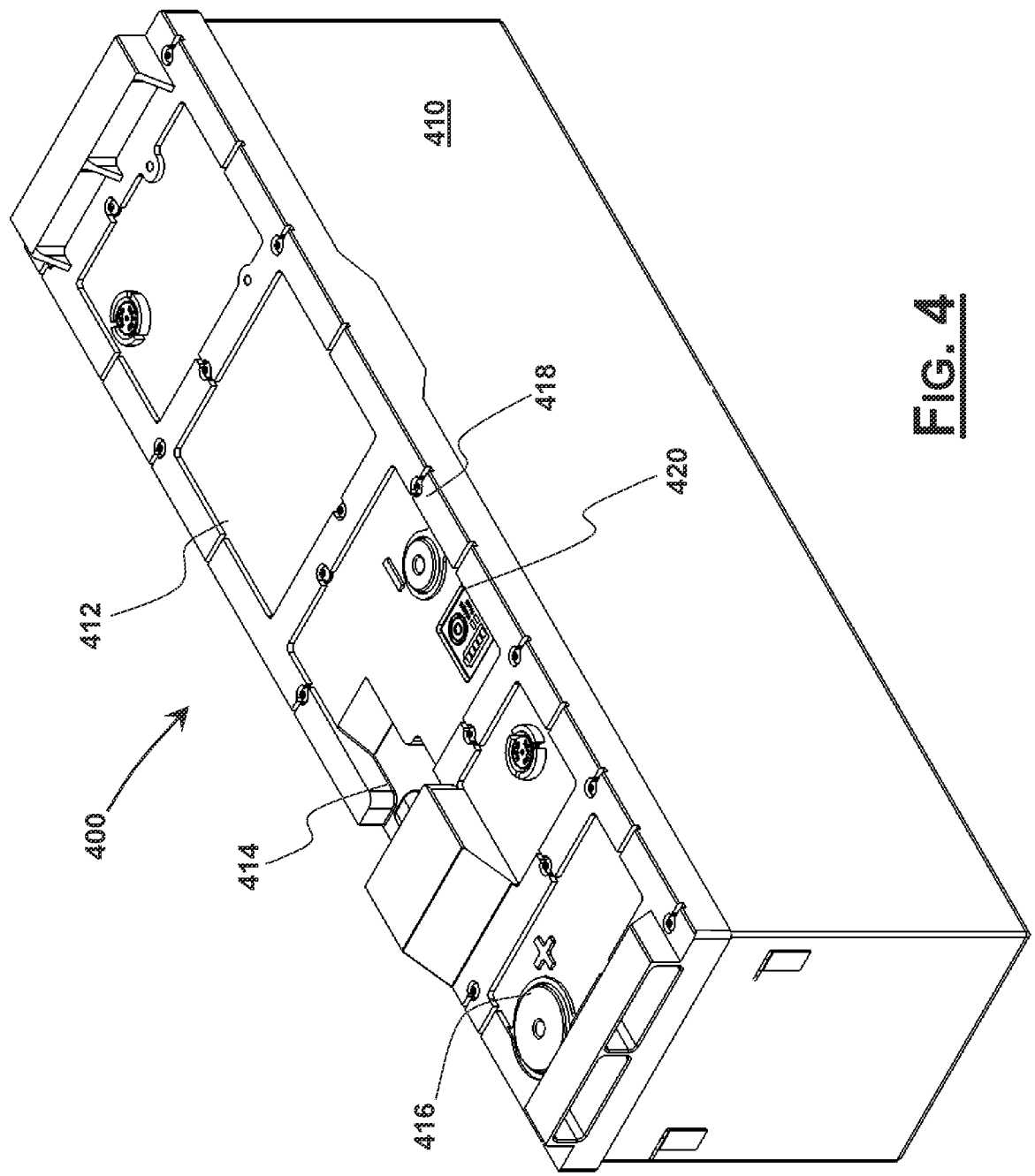
FIG. 4 is an isometric view of a preferred embodiment of the lithium iron phosphate battery module assembly 400.

Turning now to FIG. 4, there is shown a preferred embodiment of the lithium iron phosphate (LFP) battery module assembly 400. It should be understood that the battery module assembly 400 is preferably incorporated into the disclosed system as secondary battery 202. The exterior dimensions of battery module assembly 400 are consistent with a double length Group 31 form factor, although it should be understood by those of ordinary skill in the art that the disclosed features, as well as the advantages derived therefrom, could be incorporated into other battery module form factors while still providing all or most of the advantages of the battery module assemblies herein described. Note that being "consistent" with a form factor allow for flexibility in actual size. It is also anticipated that certain aspects of embodiments may be in other form factors as custom applications require.

Visible in FIG. 4, are the aluminum enclosure base 410 and the plastic lid 412. Preferred embodiments include openings for ports in the plastic lid 412 for input and output. The positive bus terminal 416 and negative bus terminal 418 are accessible through the plastic lid 412. A 6-pin flange receptacle 414, and a touch pad 420 are also visible protruding from the plastic lid 412. It will be evident to those skilled in the art that an alternative number or type of ports could be present while still being within the scope of the disclosed embodiments.

Referring now to FIG. 5, there is shown an exploded view of the battery module assembly 400. The battery module assembly 400 contains two sub-assemblies or cell arrays, one positive 530, and one negative 532. Cell arrays 530 & 532 include a plurality of lithium-ion battery cells 560. Preferably, the battery cells 560 are of the LFP type. Cell arrays 530 & 532 are glued into the aluminum enclosure base 410. Multiple self-locking wedges 536 are installed to spread the cell arrays 530 & 532 apart, and to force contact with the aluminum enclosure 410 and a thermal gap filler (not shown). A plastic lid 412 is then glued and screwed down on top of the sub-assemblies 530 & 532 and enclosure base 410.

A variety of screws are used in the assembly process, preferably HSHC, M5X10 SS 546, and Delta PT 548 are used where appropriate to secure the plastic lid 412 in place. Additionally, fasteners 542 and 544 are preferred to be used to secure the sub-assemblies 530 & 532 and the enclosure base 410 respectively. However, it will be evident to those skilled in the art that several alternative attachment methods can be used to secure individual components in place throughout the battery module 400.

Also visible in FIG. 5, are 6-pin flange receptacle 414 which protrudes through the plastic lid 412 and attached with a flying lead wire harness 550 to a battery management system (not shown). Additionally, vent plugs 540, preferably TEMISH, are used in the plastic lid 412, to prevent water and dust from entering the battery module assembly 400.

This drawings and detailed description describe aspects of another application, U.S. Provisional Ser. No. 62/980,848, filed on Feb. 24, 2020, entitled "Lithium-Ion Auxiliary Power Supply for Secondary HVAC System in Commercial Trucks." By this reference the entire disclosure, including the claims and drawings, of U.S. Provisional Ser. No. 62/980,848 is hereby incorporated into the present disclosure as though now set forth in its entirety.

The drawings and detailed descriptions herein should be considered illustrative and not exhaustive. They do not limit the invention to the particular forms and examples disclosed. To the contrary, the invention includes many further modifications, changes, rearrangements, substitutions, alternatives, design choices, and embodiments apparent to those of ordinary skill in the art, without departing from the spirit and scope of this invention.

Accordingly, in all respects, it should be understood that the drawings and detailed descriptions herein are to be regarded in an illustrative rather than a restrictive manner, and are not intended to limit the invention to the particular forms and examples disclosed. In any case, all substantially equivalent systems, articles, and methods should be considered within the scope of the invention and, absent express indication otherwise, all structural or functional equivalents are anticipated to remain within the spirit and scope of the presently disclosed systems and method.

What is claimed is:

1. An auxiliary electric battery system to be used with a vehicle having a primary electric battery system for powering at least the engine ignition system of the vehicle, wherein it is desirable for the primary electric battery system to retain a reserve ignition voltage in said primary electric battery system in order to enable engine ignition, said auxiliary battery system serving to help carry the electrical load carried by the primary electric battery system, wherein:
   a. said auxiliary electric battery system comprises one or more electric batteries configured to provide a nominal voltage between a positive terminal and a negative terminal, the nominal voltage between said positive and negative terminals being comparable to the nominal voltage of the primary electric battery system;

b. said auxiliary electric battery system is electrically connected such that said positive and negative terminals are connected in parallel to said primary electric battery system;

c. said one or more electric batteries having an electric charge storing chemistry that enables a higher current draw than said primary electric battery system when connected in parallel to said primary electric battery system, thereby enabling preferential discharge of said one or more electric batteries relative to said primary electric battery system over a voltage range somewhere between the reserve ignition voltage for said primary electric battery system and the nominal voltage of said primary electric battery system, wherein said preferential discharge is enabled without the use of an isolator switch to cause the preferential discharge of said one or more electric batteries relative to said primary electric battery system; and d. said primary electric battery is charged fully before charging said one or more electric batteries during a recharge cycle of said auxiliary electric battery system.

2. The auxiliary electric battery system of claim 1, wherein said auxiliary electric battery system is electrically connected for providing operative electric power to secondary systems in a commercial truck, the secondary systems including a heating, ventilation and air conditioning (HVAC) system associated with the commercial truck, wherein for said auxiliary electric battery system:

a. each of the one or more electric batteries comprises:
 i. a plurality of lithium-ion battery cells;
 ii. a positive bus terminal;
 iii. a negative bus terminal;
 iv. a top battery cell tray and a bottom battery cell tray; and
 v. an enclosure;

b. each lithium-ion battery cell uses a wire bond for interconnection to a printed circuit board (PCB) of the electric battery, wherein, for each of the plurality of lithium-ion battery cells, the wire bond comprises at least a positive and a negative wire;

c. each plurality of lithium-ion battery cells is held in place between the top battery cell tray and the bottom battery cell tray using an adhesive;

d. a portion of said plurality of lithium-ion battery cells comprises a positive cell array, and another portion of said plurality of lithium-ion battery cells comprises a negative cell array; and e. said positive cell array includes a processor, the processor being configured and adapted to monitor operative aspects of the lithium-ion battery cells, wherein the operative aspects include cell voltage, cell current, and temperature.

3. The auxiliary electric battery system of claim 1, wherein the electric charge storing chemistry of said one or more electric batteries is Lithium Iron Phosphate that enables a higher current draw than said primary electric battery system when the charge storing chemistry of said primary electric battery system is conventional lead acid, thereby enabling preferential discharge of said electric batteries relative to said primary electric battery system over a voltage range that is more than the nominal voltage level of said primary electric battery system.

4. The auxiliary electric battery system of claim 1, wherein the electric charge storing chemistry of said one or more electric batteries is Lithium Iron Phosphate and enables a higher current draw than said primary electric battery system when the charge storing chemistry of said primary electric battery system is conventional lead acid, and whereby said electric batteries are preferentially discharged relative to said primary electric battery system over a voltage range that is from about 12.8 to about 13.2 volts per twelve volts of nominal voltage of said primary electric battery system.

5. The auxiliary electric battery system of claim 1, wherein said primary electric battery system has an electric charge storage chemistry characterized by a steep discharge curve within the working voltage range of said primary electric battery system, said steep discharge curve being representative of said primary electric battery system's high rate of voltage output per reduction of state of charge ("SOC") within the working voltage range of said primary electric battery system.

6. The auxiliary electric battery system of claim 1, wherein said one or more electric batteries have a relatively shallow discharge curve within said working voltage range of each of said electric batteries shallow discharge curve is representative of said electric batteries' low rate of voltage output per reduction of state of charge ("SOC").

7. The auxiliary electric battery system of claim 1, wherein said auxiliary electric battery system comprises a plurality of cell arrays comprising lithium ion battery cells, wherein said plurality of cell arrays is secured into place by a plurality of self-locking wedges.

8. The auxiliary electric battery system of claim 1, wherein said primary electric battery system comprises a lead acid battery.

9. The auxiliary electric battery system of claim 1, wherein said primary electric battery system has a chemistry that enables a lower current draw than said one or more electric batteries.

10. The auxiliary electric battery system of claim 1, further comprising a relay switch configured to stop discharge of the primary electric battery system when a predetermined discharge threshold has been reached.

11. The auxiliary electric battery system of claim 10, wherein said predetermined discharge threshold is within the final 20% of the primary electric battery system's SOC.

12. The auxiliary electric battery system of claim 1, wherein said auxiliary electric battery system further comprises a lid configured to be secured to the top of said cell arrays, wherein said lid comprises vent plugs configured to prevent substances from entering said one or more electric batteries.

13. The auxiliary electric battery system of claim 1, wherein the voltage range for preferential discharge of said one or more electric batteries relative to said primary electric battery system is between the reserve ignition voltage for said primary electric battery system and the full charge voltage of said primary electric battery system.

14. The auxiliary electric battery system of claim 1, wherein said one or more electric batteries has a voltage change that remains substantially flat over the vast majority of said one or more batteries useful charge range.

15. An electrical battery system in a vehicle configured to offset the electrical load drawn from a primary battery for a motorized vehicle, wherein one or more secondary electric batteries simultaneously discharge, said electrical battery system comprises:

a. two or more batteries of equal electric potential being in a parallel configuration;

b. wherein each of said two or more batteries are classified as either a primary battery or a secondary battery according to the chemistry type of each battery, wherein said primary battery has a primary chemistry and said secondary battery has a secondary chemistry;

c. wherein said secondary chemistry enables a higher rate of current draw than said primary chemistry; and d. wherein said parallel configuration of said two or more batteries enables a preferential discharge of said one or more secondary electric batteries without the use of an isolator switch to cause the preferential discharge of said one or more electric batteries relative to said primary electric battery system;

e. wherein during a recharge cycle of said auxiliary electric battery system, said primary electric battery is charged fully before charging said one or more electric batteries.

16. The electrical battery system of claim 15, wherein said secondary electric battery is an auxiliary power supply for supplying operative power to secondary systems in a commercial truck, wherein:

a. said secondary battery comprises one or more battery modules, wherein each battery module comprises a plurality of cell arrays, and each of said battery modules further comprises:
 i. a plurality of lithium-ion battery cells;
 ii. a positive bus terminal;
 iii. a negative bus terminal;
 iv. a top battery cell tray and a bottom battery cell tray; and
 v. an enclosure;

b. each plurality of lithium-ion battery cells uses a wire bond for interconnection to a printed circuit board (PCB) in each cell array of said plurality of cell arrays, wherein, for each plurality of lithium-ion battery cells, said wire bond comprises at least a positive and a negative wire;

c. each plurality of lithium-ion battery cells is held in place between the top battery cell tray and the bottom battery cell tray using an adhesive;

d. a portion of said plurality of lithium-ion battery cells comprise a positive cell array, and another portion of said plurality of lithium-ion battery cells comprise a negative cell array; and e. said positive cell array includes a processor, the processor being configured and adapted to monitor operative aspects of the lithium-ion battery cells, wherein the operative aspects include cell voltage, cell current, and temperature.

17. The electric battery system of claim 15, wherein said secondary electric batteries have a shallow discharge curve within the working voltage range of said secondary battery's said shallow discharge curve is representative of said secondary battery's low rate of voltage output per reduction of state of charge ("SOC").

18. The electric battery system of claim 15, wherein said secondary battery comprises one or more battery modules, wherein each battery module comprises a plurality of cell arrays, wherein said plurality of cell arrays is secured into place by a plurality of self-locking wedges.

19. The electric battery system of claim 15, wherein said primary battery is a lead acid battery.

20. The electric battery system of claim 15, wherein said primary electric battery has a chemistry that enables a lower current draw than said secondary electric batteries.

21. The electric battery system of claim 15, wherein said secondary electric batteries enable a higher current draw than said primary battery.

22. The electric battery system of claim 15, further comprising a relay switch configured to stop discharge of the primary battery when a predetermined discharge threshold has been reached.

23. The electric battery system of claim 22, wherein said predetermined discharge threshold is within the lower 20% of the primary battery's SOC.

24. The electric battery system of claim 15, wherein said secondary battery comprises one or more battery modules, wherein each said battery module comprises a plurality of cell arrays, and each said battery module further comprises a lid configured to be secured to the top of said cell arrays, wherein said lid comprises vent plugs configured to prevent substances from entering said battery module.

25. An auxiliary electric battery system to be used with a vehicle having a primary electric battery system for powering at least the engine ignition system of the vehicle, wherein it is desirable for the primary electric battery system to retain a reserve ignition voltage in said primary electric battery system in order to enable engine ignition, said auxiliary battery system serving to help carry the electrical load carried by the primary electric battery system, wherein:

a. said auxiliary electric battery system comprises one or more electric batteries configured to provide a nominal voltage between a positive terminal and a negative terminal, the nominal voltage between said positive and negative terminals being comparable to the nominal voltage of the primary electric battery system;

b. said auxiliary electric battery system is characterized to provide a full operating charge above said reserve ignition voltage and enables preferential discharge of the auxiliary battery system above about 12.8 volts;

c. said auxiliary electric battery system is electrically connected such that said positive and negative terminals are connected in parallel to said primary electric battery system;

d. said one or more electric batteries having an electric charge storing chemistry that enables a higher current draw than said primary electric battery system when connected in parallel to said primary electric battery system, thereby enabling preferential discharge of said one or more electric batteries relative to said primary electric battery system over a voltage range between the reserve ignition voltage for said primary electric battery system and the full charge voltage of said primary electric battery system, wherein said preferential discharge is enabled without the use of an isolator switch to cause the preferential discharge of said one or more electric batteries relative to said primary electric battery system; and e. said primary electric battery is charged fully before charging said one or more electric batteries during a recharge cycle of said auxiliary electric battery system.

26. The auxiliary electric battery system of claim 25, wherein said one or more electric batteries has a voltage change that remains substantially flat over the vast majority of said one or more electric batteries useful charge range.

* * * * *